United States Patent [19]

Maeda et al.

[11] Patent Number: 4,996,480
[45] Date of Patent: Feb. 26, 1991

[54] IMAGE RECONSTRUCTING DEVICE FOR USE IN MAGNETIC RESONANCE IMAGING APPARATUS

[75] Inventors: Akira Maeda, Gardena, Calif.; Koichi Sano, Sagamihara, Japan; Tetsuo Yokoyama, Tokyo, Japan; Hideaki Koizumi, Katsuta, Japan

[73] Assignee: Hitachi, Ltd., Tokyo, Japan

[21] Appl. No.: 418,224

[22] Filed: Oct. 6, 1989

Related U.S. Application Data

[63] Continuation-in-part of Ser. No. 262,282, Oct. 25, 1988, Pat. No. 4,901,021.

[30] Foreign Application Priority Data

Nov. 6, 1987 [JP] Japan .................... 62-279217
Oct. 7, 1988 [JP] Japan .................... 63-251762

[51] Int. Cl.⁵ ............................................. G01R 33/20
[52] U.S. Cl. ................................................... 324/309
[58] Field of Search ............... 324/300, 307, 309, 312, 324/314; 128/653 A

[56] References Cited

U.S. PATENT DOCUMENTS

| | | | |
|---|---|---|---|
| 4,361,807 | 11/1982 | Burl et al. | 324/309 |
| 4,506,223 | 3/1985 | Bottomley | 324/309 |
| 4,567,440 | 1/1986 | Haselgrove | 324/309 |
| 4,581,582 | 4/1986 | Redington | 324/309 |
| 4,585,992 | 4/1986 | Maudsley | 324/309 |
| 4,585,993 | 4/1986 | Bottomley | 324/309 |
| 4,588,948 | 5/1986 | Mansfield | 324/309 |
| 4,618,827 | 10/1986 | Redington | 324/309 |
| 4,646,023 | 2/1987 | Young | 324/309 |
| 4,654,593 | 3/1987 | Ackerman | 324/309 |
| 4,689,568 | 8/1987 | Matsui | 324/309 |
| 4,698,592 | 10/1987 | Feinberg | 324/309 |
| 4,716,369 | 12/1987 | Sekihara | 324/309 |
| 4,733,185 | 3/1988 | Bottomley | 324/309 |

OTHER PUBLICATIONS

Y. S. Kin, C. W. Mun, and Z. H. Cho, "Chemical-Shift Imaging with Large Magnetic Field Inhomogeneity", (Magnetic Resonance in Medicine, vol. 4, No. 5, 1987, pp. 452–460).
Albert Macovski and Craig Meyer, "A Novel Fast Scanning System", (Proceedings of the 5th Society of Magnetic Resonance in Medicine, 1986, pp. 156–157).

Primary Examiner—Michael J. Tokar
Attorney, Agent, or Firm—Antonelli, Terry, Stout & Kraus

[57] ABSTRACT

A magnetic resonance signal is detected at a plurality of different periods of time in accordance with the phase shift of a plurality of chemical shift components while varying the intensity of a gradient magnetic field with time, a plurality of magnetic resonance signal thus obtained are used for estimating a magnetic resonance signal due to only a predetermined chemical shift component, the phase rotation of the predetermined chemical shift component is corrected in the estimated resonance signal, and further a blur due to chemical shift components other than the predetermined one is corrected to obtain a tomogram formed of only the predetermined chemical shift component. Alternatively, one measured resonance signal is modified by an image reconstruction algorithm peculiar to each of a plurality of chemical shift components, to obtain tomograms corresponding to the chemical shift components.

8 Claims, 3 Drawing Sheets

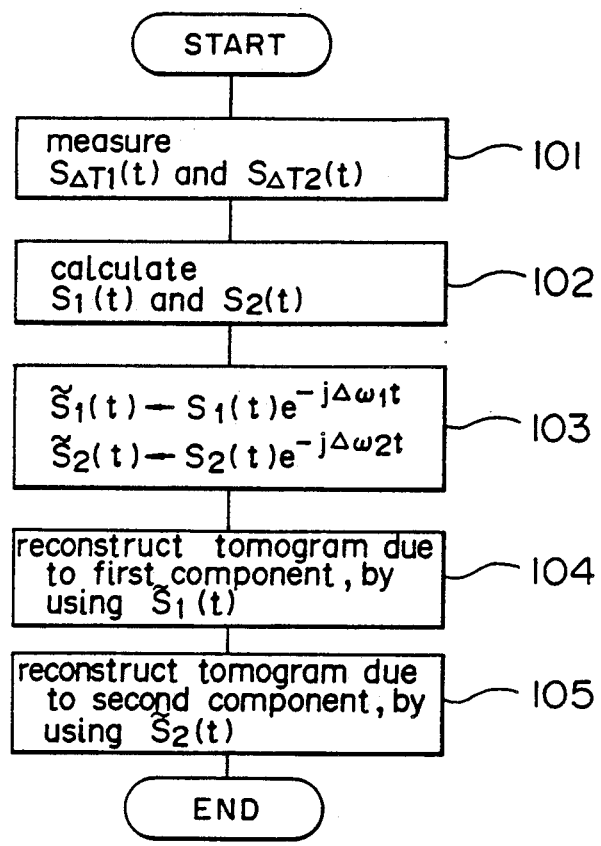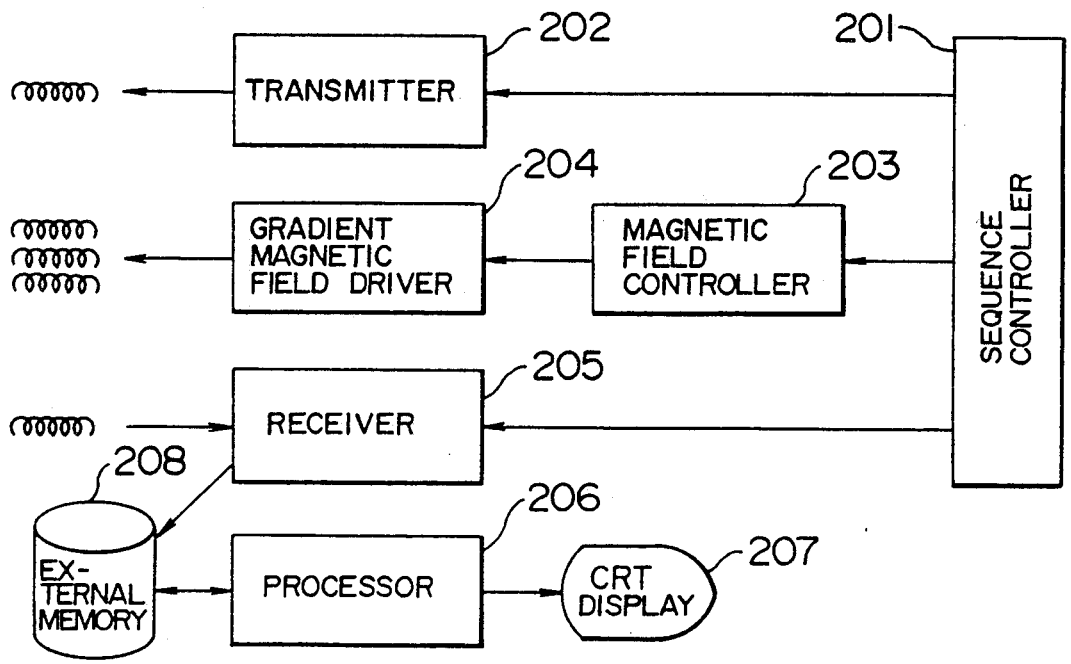

4,996,480

IMAGE RECONSTRUCTING DEVICE FOR USE IN MAGNETIC RESONANCE IMAGING APPARATUS

CROSS-REFERENCE TO RELATED APPLICATIONS

This application is a continuation-in-part of copending application Ser. No. 262,282, filed Oct. 25, 1988, now U.S. Pat. No. 4,901,021.

BACKGROUND OF THE INVENTION

The present invention relates to an apparatus for obtaining a tomogram of a living body by utilizing the nuclear magnetic resonance phenomenon, and more particularly to an image reconstructing device suited to separate chemical shift components from measured resonance signals and to form a tomogram of each chemical shift component, by a high-speed imaging method in which a resonance signal is measured in a state that the strength of a gradient magnetic field is varied with time. Incidentally, the image reconstruction means that a tomogram is reconstructed from a measured resonance signal.

A first method of forming a tomogram of each chemical shift component in the magnetic resonance imaging (hereinafter referred to as "MRI") is described in, for example, an article entitled "Chemical-Shift Imaging with Large Magnetic Field Inhomogeneity" (Magnetic Resonance in Medicine, Vol. 4, No. 5, 1987, pages 452 to 460). In the first method, resonance signals are measured at some different periods of time in a state that the strength of a gradient magnetic field is kept constant, tomograms of an object are reconstructed from measured resonance signals by the two-dimensional Fourier transformation method, and tomograms corresponding to chemical shift components are separated from the reconstructed tomograms. In more detail, each of the chemical shift components is slightly different in resonance frequency from each other. Thus, when a resonance signal is measured at different periods of time, tomograms corresponding to the chemical shift components are different from each other in phase, that is, in the state of nuclear spin. Further, image processing is carried out so that tomograms corresponding to undesired chemical shift components cancel each other on the basis of the above phase difference, to obtain tomograms each formed of a single chemical shift component.

While, a novel imaging method is described in, for example, an article entitled "A Novel Fast Scanning System" (Proceedings of 5th Society of Magnetic Resonance in Medicine, 1986, pages 156 and 157). In this method, a resonance signal is measured in a state that the strength of a gradient magnetic field is varied with time. As a result, the resonance signal can be continuously measured, and thus a time necessary for imaging can be shortened in a great degree.

A general method of reconstructing a tomogram for a resonance signal which is obtained in the abovementioned manner, that is, the so-called correlation method is discussed on page 781 of the Proceedings of the 6th Society of Magnetic Resonance in Medicine held in 1987.

A second method of forming tomograms of a plurality of chemical shift components at the same time from a resonance signal which is measured only once, is discussed on page 230 of the Proceedings of the 6th Society of Magnetic resonance in Medicine held in 1987.

The second method utilizes a fact that when the strength of two gradient magnetic fields in different directions is varied with time to obtain two-dimensional tomograms, the difference in resonance frequency between chemical shift components generates blurred tomograms. Let us pay attention to the atomic nucleus of hydrogen, by way of example. When a tomogram is reconstructed in accordance with the resonance frequency of the atomic nucleus of hydrogen contained in water, a resonance signal due to the atomic nucleus of hydrogen contained in fat is subjected to additional phase rotation, and thus a blurred tomogram is superposed on the tomogram due to water. When a tomogram is reconstructed in accordance with the resonance frequency of the atomic nucleus of hydrogen contained in fat, a tomogram due to water is blurred. That is, when a tomogram is reconstructed in accordance with the resonance frequency of the atomic nucleus of hydrogen contained in one of water and fat, a blurred tomogram due to the other substance is superposed on the tomogram due to one substance. When a blurred tomogram can be neglected, the tomogram due to water and the tomogram due to fat can be obtained from the single resonance signal.

The first method has given no consideration to the matter that tomograms due to chemical shift components may be reconstructed at high speed, by using a time-varying gradient magnetic field. The reason for this is as follows.

Now, let us express the tomogram formed of the i-th chemical shift component by $\rho_i(x, y)$, where x and y designate two-dimensional coordinate values on the tomogram, with the origin at the center of a field of view. Further, let us express the deviation of a resonance frequency of each chemical shift component from a reference frequency by $\Delta\omega_i$. It is to be noted that the reference frequency means the resonance frequency corresponding to a specific chemical shift component under a static magnetic field. Then, the resultant resonance signal $S(t)$ of respective resonance signals of chemical shift components is given by the following equation:

$$S(t) = C \sum_i \int dx\, dy\, \rho_i(x,y) \exp[-j\gamma\{k_x(t)x + k_y(t)y\} + j\Delta\omega_i t] \quad (1)$$

where $$k_x(t) = \int_0^t G_x(t')dt',\quad k_y(t) = \int_0^t G_y(t')dt',$$

and $j=\sqrt{1}$. Further, $G_x$ and $G_y$ indicate the strength of x- and y-gradient magnetic fields, respectively, $\gamma$: a nuclear gyromagnetic ratio, and C: a constant.

The inhomogeneity of static magnetic field and the $T_2$ effect (namely, transverse relaxation time effect) have no connection with the following explanation, and hence explanation thereof will be omitted. Now, let us consider a case where $G_x$ amd $G_y$ are constant as in the two-dimensional Fourier transformation method, for example, a case where $G_x(t)=G_x^0$ (namely, a constant) and $G_y(t)=0$. The resonance signal $S(t)$ is rewritten as follows:

$$S(t) = C \sum_i \int dx dy \rho_i(x,y) \cdot \exp\left[-j\gamma \cdot G_x^0 \left(x - \frac{\Delta\omega_i}{\gamma G_x^0}\right) t\right] \quad (2)$$

Thus, tomograms formed of different chemical shift components are shifted from each other by an amount equal to $\Delta\omega_i/(\gamma G_x^0)$. As a result, an overlapping tomogram is formed. In a case where $G_x$ and $G_y$ vary with time, however, signal components due to different chemical shift components do not appear as signal components which are merely shifted from each other, but interact on each other in a complicated manner. Thus, it is impossible to reconstruct tomograms corresponding to chemical shift components at the same time. That is, the first chemical shift imaging method is inapplicable to a case where both $G_x$ and $G_y$ vary with time.

While, according to the second method, the point spread function (hereinafter referred to as "PSF") at a focused tomogram is equal in average power (that is, average brightness) to the PSF at a tomogram which is out of focus, and hence it is necessary to remove the influence of the tomogram which is out of focus, on the focused image. In other words, the shape of the PSF is a function for indicating the degree of blur, and a tomogram due to a desired chemical shift component is equal in power to a tomogram due to an undesired chemical shift component. Hence, it is impossible to obtain focused tomograms of a plurality of chemical shift components at the same time.

Various methods of reconstructing tomograms from the resonance signal of the equation (1) have been known. The most general one of the above methods is the correlation method. Accordingly, the correlation method which is described in IEEE Transactions on Medical Imaging, Vol. 7, No. 1, pp. 26-31, March 1988, for example, will be used in the following explanation. It is needless to say that various methods other than the correlation method can be used for reconstructing tomograms.

Now, let us express a tomogram which is reconstructed in accordance with the k-th chemical shift component, by $\bar{\rho}_k(x, y)$. Then, $\bar{\rho}_k(x, y)$ is generally given by a complex function as follows:

$$\bar{\rho}_k(x,y) = \int dt s(t) \exp[+j\gamma\{kx(t)x + ky(t)y\}] \cdot \exp[-j\Delta\omega_k t] \cdot W(t) \quad (3)$$

where $W(t)$ indicates a weight coefficient for controlling a PSF.

When the equation (1) is substituted in the equation (3), we can obtain the following equation:

$$\bar{\rho}_k(x,y) = C \sum_i \int dx' dy' \rho_1(x',y') \cdot \exp[-j\gamma\{kx(t)(x' - x) + ky(t)(y' - y)\}] \cdot \exp[+j(\Delta\omega_1 - \Delta\omega_k)t] \cdot W(t) = (h_{kk} * \rho_k)(x,y) + \sum_{i \neq k}(h_{ki} * \rho_1)(x,y) \quad (4)$$

where a mathematical sign * indicates two-dimensional convolution which is given by the following equation:

$$(f * g)(x,y) \underset{\text{def}}{\equiv} \int dx' dy' f(x',y') g(x - x', y - y') \quad (5)$$

Further, in the equation (4), $h_{ki}(x, y)$ indicates a PSF which is given by the following equation:

$$h_{ki}(x, y) = C \int dt \exp[j\gamma\{kx(t)x + ky(t)y\}] \cdot \exp[+j(\Delta\omega_i - \Delta\omega_k)t] \cdot W(t) \quad (6)$$

In more detail, $h_{kk}$ indicates a focused PSF, and $h_{ki}(k \neq i)$ a PSF which is out of focus. The PSF $h_{ki}$ can be obtained from the time-variation pattern of each gradient magnetic field and the weight coefficient $W(t)$, and hence is considered to be a known function.

From the equation (6), we can obtain the following equation:

$$\int dx dy |h_{kk}(x, y)|^2 = \int dx dy |h_{ki}(x, y)|^2 \text{ for all } i \quad (7)$$

As is evident from the equation (7), it is impossible to neglect the influence of chemical shift components other than the k-th chemical shift component on the tomogram $\bar{\rho}_k$ given by the equation (4). This is true of a case where only two chemical shift components exist as in the atomic nucleus of hydrogen.

SUMMARY OF THE INVENTION

It is accordingly a first object of the present invention to provide an image reconstructing device which can solve the above problems and can form a tomogram of each chemical shift component directly by the high-speed imaging method using time-varying gradient magnetic fields, with the aid of a tomogram reconstruction algorithm peculiar to each chemical shift component.

It is a second object of the present invention to provide an image reconstructing device, in which a chemical shift component included in the equation (4) and put out of focus is estimated and removed, to reconstruct tomograms of a plurality of chemical shift components from a resonance signal measured only once.

In order to attain the first object, according to an aspect of the present invention, a resonance signal due to a desired chemical shift component is produced from a plurality of resonance signals measured at different periods of time, and an image reconstruction algorithm peculiar to the desired chemical shift component is applied to the produced resonance signal, to form a tomogram of the desired chemical shift component.

A resonance signal $S_{\Delta T}(t)$ obtained at a time which is deviated from a predetermined time by $\Delta T$, is given by the following equation:

$$S_{\Delta T}(t) = C \sum_i \int dx dy \rho_i(x,y) \exp[-j\gamma\{k_x(t)x + k_y(t)y\} + j\Delta\omega_i t] \cdot \exp[j\Delta\omega_i \Delta T] \quad (8)$$

The final factor on the right-hand side of the equation (8) indicates that each chemical shift component contributing to the resonance signal $S_{\Delta T}(t)$ has phase shift of $\exp[j\Delta\omega_i \Delta T]$. The resonance frequency $\omega_i$ of each chemical shift component is known, and hence the above phase shift is determined depending upon the time deviation $\Delta T$. By measuring resonance signals for a plurality of values of $\Delta T$ and performing an appropriate arithmetic operation for the resonance signals, a resonance signal $S_i(t)$ due to only the i-th chemical shift component can be obtained as follows:

$$S_i(t) = C \int dx\, dy\, \rho_i(x, y) \exp[-j\gamma\{k_x(t)x + k_y(t)y\} + j\Delta\omega_i t] \quad (9)$$

In a case where a tomogram of the i-th chemical shift component is reconstructed, a resonance signal $\bar{S}_i(t)$ which is obtained by removing the phase rotation due to a change in resonance frequency (that is, the phase shift from a reference frequency at a measuring time) from the equation (9), is expressed as follows:

$$\bar{S}_i(t) = S_i(t) \exp[j\Delta\omega_i t] \quad (10)$$

A tomogram due to the i-th chemical shift component is reconstructed by using the resonance signal $\bar{S}_i(t)$.

In order to attain the second object, according to another aspect of the present invention, there is provided an image reconstructing device, in which a plurality of sampling operations are performed for a resonance signal measured only once, to obtain necessary data, a tomogram $\bar{\rho}_k$ is reconstructed from the above data while paying attention to the k-th chemical shift component, and the influence of chemical shift components other than the k-th one on the tomogram $\bar{\rho}_k$ is estimated and removed.

In more detail, the initial estimated value $\bar{\rho}_k^{(o)}$ of the tomogram due to the k-th chemical shift component is set as follows:

$$\bar{\rho}_k^{(o)} = \bar{\rho}_k$$

The (n+1)th estimated value $\bar{\rho}_k^{(n+1)}$ of the tomogram is calculated from the n-th estimated value $\bar{\rho}_k^{(n)}$ (where n>0) as follows:

$$\bar{\rho}_k^{(n+1)} = \bar{\rho}_k - \sum_{i \neq k} h_{ki}{}^* \Lambda_n[\bar{\rho}_i^{(n)}] \quad (11)$$

where $\Lambda_n$ is given by the following equation:

$$\Lambda_n(C) \begin{cases} = R_e(C) & \text{if } R_e(C) \geq \theta_n \\ = 0 & \text{otherwise} \end{cases} \quad (12)$$

Further, $R_e(C)$ in the equation (12) indicates the real part of a complex number C, and $\theta_n$ ($\geq 0$) indicates a threshold parameter dependent upon a number n.

In actual processing, the estimation based upon the equation (11) is repeated till an appropriate end condition is satisfied, to obtain an excellent tomogram of the k-th chemical shift component.

Now, let us consider the n-th estimated value $\bar{\rho}_k^{(n)}$ as an approximation to the true tomogram $\rho_k$ of the k-th chemical shift component. Then, the influence of chemical shift components other than the k-th component on the estimated value $\bar{\rho}_k^{(n)}$ can be removed by using the equation (11). Thus, a better approximation to the true tomogram $\rho_k$ is obtained. By repeating the above processing, the estimated value $\bar{\rho}_k^{(n)}$ can approach to the true tomogram $\rho_k$.

The tomogram $\rho_k$ is proportional to the spin density of the k-th chemical shift component. Accordingly, $\rho_k$ is a real number, and has a value which is not negative.

Further, the function $\Lambda_n$ included in the equation (11) corresponds to an operation for taking out a component which is a real number and has a positive or zero value, from the n-th estimated value $\bar{\rho}_k^{(n)}$ at a time the threshold parameter $\theta_n$ is equal to zero. Accordingly, a value $\Lambda_n[\bar{\rho}_k^{(n)}]$ comes closer to the true tomogram $\rho_k$, as compared with the n-th estimated value $\bar{\rho}_k^{(n)}$. Thus, the accuracy of the estimated value, due to the equation (11) is improved.

Further, the speed of convergence can be increased by decreasing the threshold parameter $\theta_n$ as the number n is larger. This is because the second term on the right-hand side of the equation (4) contributes greatly to $\bar{\rho}_k$ for the number n having a small value, and a threshold parameter $\theta_n$ having a large value contributes only a little to the estimated value due to the equation (11).

As has been explained in the above, according to the present invention, chemical shift components are, from the first, separated from each other in a high-speed imaging method using time-varying gradient magnetic fields, to form a tomogram of each chemical shift component. Thus, a tomogram due to each chemical shift component can be constructed at high speed.

BRIEF DESCRIPTION OF THE DRAWINGS

FIG. 1 is a flow chart showing an example of the processing in an embodiment of the present invention.

FIG. 2 is a block diagram showing the circuit configuration of an MRI apparatus.

DESCRIPTION OF THE PREFERRED EMBODIMENTS

Figure 3:
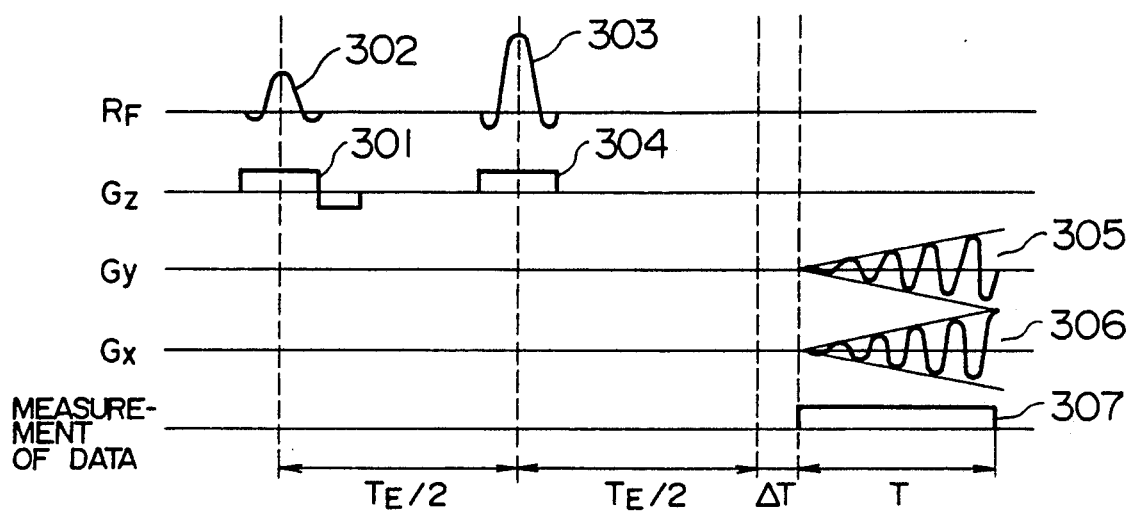
FIG. 3 is a schematic diagram showing an example of the pulse sequence used in the present invention.

Now, a first embodiment of the present invention will be explained, with reference to FIGS. 1 to 6.

FIG. 2 is a block diagram showing the circuit configuration of an MRI apparatus, in which the present invention is realized. Referring to FIG. 2, the MRI apparatus includes a sequence controller 201 for controlling each part of the apparatus in accordance with a predetermined procedure, a transmitter 202 for sending out a high-frequency pulse to generate magnetic resonance, a gradient magnetic field driver 204 for generating a gradient magnetic field, a magnetic field controller 203 for controlling the gradient magnetic field driver, a receiver 205 for receiving a magnetic resonance signal which is generated by an object to be inspected, a processor 206 for reconstructing a tomogram and for performing various arithmetic operations, a CRT display 207 for displaying a tomogram, and an external memory 208 for storing therein tomogram data and others.

FIG. 3 shows an example of the pulse sequence which is used in a first embodiment of the present invention. Referring to FIG. 3, a 90°-RF pulse 302 is generated at the same time as a pulse 301 for generating a gradient mangetic field in a Z-direction is applied to a coil. Thus, spins in a desired slice plane (namely, an X-Y plane in this example) are excited. Next, a 180°-RF pulse 303 for generating a spin echo and a pulse 304 for generating a gradient magnetic field in the Z-direction are simultaneously generated. Thereafter, a resonance signal is measured for a period T (indicated by reference numeral 307) in a state that a gradient magnetic field 305 in a Y-direction and a gradient magnetic field 306 in an X-direction are both generated. The strength of each of the gradient magnetic field 305 and the gradient magnetic field 306 varies with time. The gradient magnetic field 305 and the gradient magnetic field 306 are applied to obtain a resonance signal at various points in the spatial frequency region corresponding to the X-Y plane. Let us express the time interval between the generation of the 90°-RF pulse 302 and the generation of the 180°-RF pulse 303 by $T_E/2$. When a time $T_E/2$ has elapsed after the 180°-RF pulse 303 was generated, the phase shift of every atom is returned to zero, and a spin echo signal is generated. Further, when a time $\Delta T$ has elapsed after the spin echo signal was generated, the gradient magnetic field 305 in the Y-direction and the gradient magnetic field 306 in the X-direction are both generated, and the measurement of resonance signal is started. In the first embodiment of the present invention, a set of necessary data for reconstructing a tomogram is obtained from a plurality of times of measurements. The value of $\Delta T$ is varied in each of the measurements. The resonance data is obtained by a plurality of samplings in each measurement.

Figure 4:
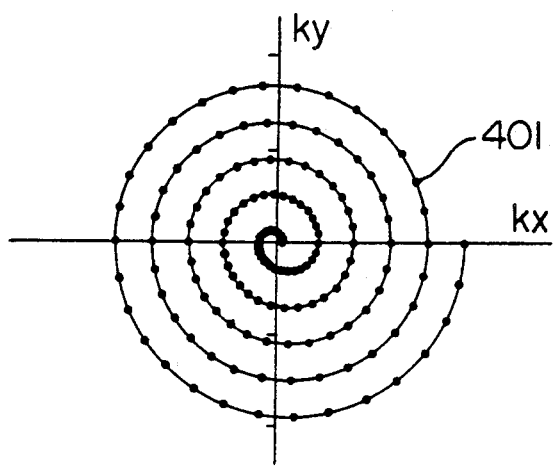
FIG. 4 is a graph showing the distribution of signal measuring point in a spatial frequency region.

FIG. 4 shows an example of the distribution of $k_x$ and $k_y$ which indicate the integrated values of the gradient magnetic fields 306 and 305, respectively.

Now, let us suppose that $G_x(t)$ and $G_y(t)$ are given by the following equations:

$$\begin{cases} G_x(t) = A \cdot \cos Bt - ABt \sin Bt \\ G_y(t) = A \cdot \sin Bt + ABt \cos Bt \end{cases}$$

where A and B are constants.

Then, $k_x(t)$ and $k_y(t)$ are given by the following equations:

$$\begin{cases} k_x(t) = At \cdot \cos Bt \\ k_y(t) = At \cdot \sin Bt \end{cases}$$

Thus, the combination of $k_x(t)$ and $k_y(t)$ will produce the locus shown in FIG. 4. In FIG. 4, reference numeral 401 indicates one of measuring points which are arranged at a time interval in the period 307.

Figure 5:
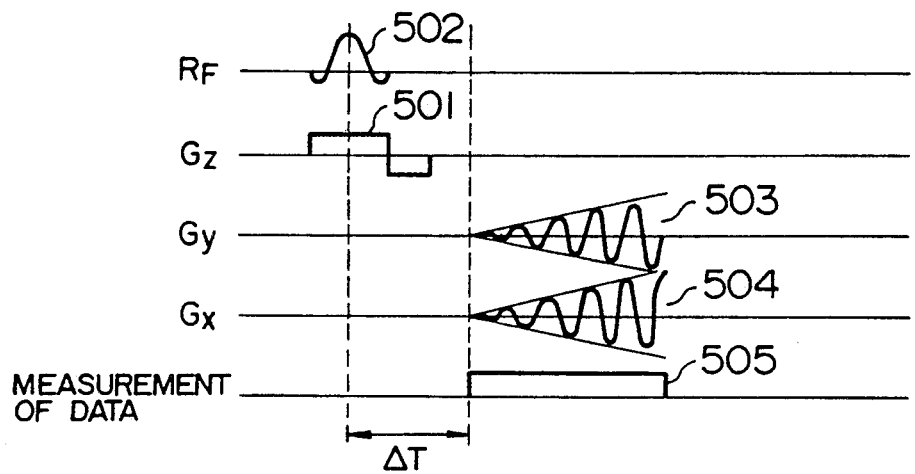
FIG. 5 is a schematic diagram showing another example of the pulse sequence used in the present invention.

FIG. 5 shows a sequence in a case where a 180°-RF pulse is not used, but an echo signal due to the reversal of a gradient magnetic field is measured. Referring to FIG. 5, a pulse 501 for generating a gradient magnetic field in the Z-direction and a 90°-RF pulse 502 are simultaneously generated to excite only spins in a desired slice plane, as in the sequence of FIG. 3. When a time $\Delta T$ has elapsed after the 90°-RF pulse 502 was generated, a resonance signal is measured for a period 505 in a state that a gradient magnetic field 503 in the Y-direction and a gradient magnetic field 504 in the X-direction are generated.

The present invention can be realized in the same manner for the sequence of FIGS. 3 and 5.

FIG. 1 is a flow chart showing the steps of procedure for reconstructing tomograms in accordance with the present invention, for a case where only two chemical shift components are detected.

In step 101 of FIG. 1, a resonance signal $S_{\Delta T_1}(t)$ for $\Delta T = \Delta T_1$ and a resonance signal $S_{\Delta T_2}(t)$ for $\Delta T = \Delta T_2$ ($\Delta T_2 \neq \Delta T_1$) are measured (where $0 \leq t \leq T$). It is to be noted that the above-mentioned $\Delta T$ indicates $\Delta T$ in FIGS. 3 and 5.

In step 102, a resonance signal $S_1(t)$ due to only the first chemical shift component and a resonance signal $S_2(t)$ due to only the second chemical shift component are determined by the following equations:

$$S_1(t) = (S_{\Delta T_1}(t)e^{-j\Delta\omega_2 \Delta T_1} - S_{\Delta T_1}(t)e^{-j\Delta\omega_2 \Delta T_2}) / \{e^{j(\Delta\omega_1 - \Delta\omega_2)\Delta T_1} - e^{j(\Delta\omega_1 - \Delta\omega_2)\Delta T_2}\}$$

$$S_2(t) = (S_{\Delta T_1}(t)e^{-j\Delta\omega_1 \Delta T_1} - S_{\Delta T_2}(t)e^{-j\Delta\omega_1 \Delta T_2}) / \{e^{j(\Delta\omega_2 - \Delta\omega_1)\Delta T_1} - e^{j(\Delta\omega_2 - \Delta\omega_1)\Delta T_2}\}$$

In order to determine the resonance signals $S_1(t)$ and $S_2(t)$ by the above equations, it is required to satisfy the following formula:

$$(\Delta\omega_2 - \Delta\omega_1) \times (\Delta T_2 - \Delta T_1) \neq 2n\pi$$

where n is an integer.

Accordingly, the values of $\Delta T_1$ and $\Delta T_2$ are previously selected so as to satisfy, for example, the following equation:

$$(\Delta\omega_2 - \Delta\omega_1) \times (\Delta T_2 - \Delta T_1) = \pi$$

In step 103, the phase orientation due to a change in resonance frequency is corrected as indicated by the following equations:

$$\begin{cases} \overline{S}_1(t) = S_1(t)e^{-j\Delta\omega_1 t} \\ \overline{S}_2(t) = S_2(t)e^{-j\Delta\omega_2 t} \end{cases}$$

Thus, resonance signals $\overline{S}_1(t)$ and $\overline{S}_2(t)$, each of which is a resonance signal due to a specific chemical shift component, are obtained from the resonance signals $S_1(t)$ and $S_2(t)$.

In step 104, a tomogram $\bar{\rho}_1(x, y)$ due to the first chemical shift component is determined from the resonance signal $\overline{S}_1(t)$ by the following equation:

$$\bar{\rho}_1(x,y) = Re\left[ \int_0^T dt W(t) \overline{S}_1(t) e^{+j\gamma\{k_x(t)x + k_y(t)y\}} \right]$$

where W(t) is equal to $\sqrt{k_x(t)^2 + k_y(t)^2}$ for a case where the locus of FIG. 4 is used, and Re[] is a sign for indicating a real part.

In step 105, a tomogram $\bar{\rho}_2(x, y)$ due to the second chemical shift component is determined, as in the step 104, from the resonance signal $\overline{S}_2(t)$ by the following equation:

$$\bar{\rho}_2(x,y) = Re\left[ \int_0^T dt W(t) \overline{S}_2(t) e^{+j\gamma\{k_x(t)x + k_y(t)y\}} \right]$$

That is, the tomogram due to the first chemical shift component and the tomogram due to the second chemical shift component can be reconstructed by the above steps.

Figure 6:
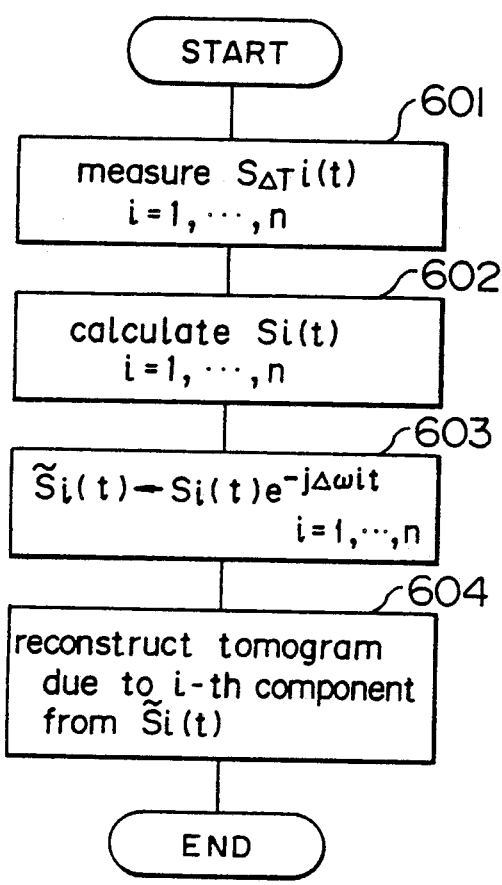
FIG. 6 is a flow chart showing the processing in a first embodiment of the present invention.

FIG. 6 is a flow chart showing the steps of procedure for reconstructing tomograms in accordance with the present invention, for a case where n chemical shift components are included.

In step 601 of FIG. 6, a resonance signal $S_{\Delta T_1}(t)$ for $\Delta T = \Delta T_1$, a resonance signal $S_{\Delta T_2}(t)$ for $\Delta T = \Delta T_2$ and a resonance signal $S_{\Delta T_n}(t)$ for $\Delta T = \Delta T_n$ are measured (where $0 \leq t \leq T$). It is to be noted that the above-mentioned T and $\Delta T$ indicate T and $\Delta T$ shown in FIGS. 3 and 5, respectively.

In step 602, a resonance signal $S_i(t)$ due to only the i-th chemical shift component (where $i = 1, 2, \ldots,$ and n) is determined by the following equation:

$$\begin{pmatrix} S_1(t) \\ S_2(t) \\ \cdot \\ \cdot \\ \cdot \\ S_n(t) \end{pmatrix} = A^{-1} \begin{pmatrix} S_{\Delta T_1}(t) \\ S_{\Delta T_2}(t) \\ \cdot \\ \cdot \\ \cdot \\ S_{\Delta T_n}(t) \end{pmatrix}$$

where a matrix A is given by the following equation:

$$A = \begin{pmatrix} e^{j\Delta\omega_1 \Delta T_1} e^{j\Delta\omega_2 \Delta T_1} \ldots e^{j\Delta\omega_n \Delta T_1} \\ e^{j\Delta\omega_1 \Delta T_2} e^{j\Delta\omega_2 \Delta T_2} \ldots e^{j\Delta\omega_n \Delta T_2} \\ \cdot \quad \cdot \quad \cdot \\ \cdot \quad \cdot \quad \cdot \\ e^{j\Delta\omega_1 \Delta T_n} e^{j\Delta\omega_2 \Delta T_n} \cdots e^{j\Delta\omega_n \Delta T_n} \end{pmatrix}$$

Values of $\Delta T_1$ to $\Delta T_n$ are selected so that an inverse matrix $A^{-1}$ can be formed.

In step 603, a resonance signal $\overline{S}_i(t)$, in which the phase rotation due to a change in resonance frequency has been corrected, is obtained in the following manner:

$$\overline{S}_i(t) = S_i(t) e^{-j\Delta\omega_i t}$$

where $i = 1, 2, 3, \ldots,$ and n.

In step 604, a tomogram $\overline{\rho}_i(x, y)$ due to the i-th chemical shift component is determined from the resonance signal $\overline{S}_i(t)$ by the following equation:

$$\overline{\rho}_i(x,y) = Re\left[ \int_0^T dt W(t) \overline{S}_i(t) e^{+j\gamma\{k_x(t)x + k_y(t)y\}} \right]$$

That is, n tomograms corresponding to n chemical shift components can be separately reconstructed by the above steps.

As can be seen from the above explanation, the first embodiment is independent of how the strength of gradient magnetic field varies with time, and is also independent of the algorithm for reconstructing a tomogram. Further, the present embodiment is applicable to a case where a three-dimensional spin-density image is formed. In the first and second objects of the invention mentioned above, a resonance signal necessary for reconstructing a tomogram is measured by generating a single resonance. The present invention can be applied in the situation in which a resonance signal necessary for reconstructing a tomogram consists of a plurality of part signals. Each of the part signals is measured by generating a single resonance. In the situation in which the tomogram consists of a plurality of part signals, the value of $\Delta T$ shown in FIG. 3 or FIG. 5 is fixed to a certain value and measurements are carried out by generating a plurality of resonances. A set of resonance signals necessary for reconstructing a tomogram is obtained from the measurements. Then, the value of $\Delta T$ is set to another value and the same measurements are again taken, so that another set of resonance signals necessary for reconstructing a tomogram is obtained.

In the present invention, all the steps of procedure for reconstructing a tomogram include only linear operations. Accordingly, the order of the step for obtaining $\overline{S}_i(t)$ from $S_{66 T}(t)$ and the step for forming a tomogram of a chemical shift component, may be inverted, that is, an arithmetic operation for obtaining $\overline{S}_i(t)$ from $S_{\Delta T}(t)$ may be performed after an arithmetic operation for obtaining $\overline{\rho}_i(x, y)$ from $S_i(t)$.

Next, a second embodiment of the present invention will be explained, with reference to FIG. 7.

Figure 7:
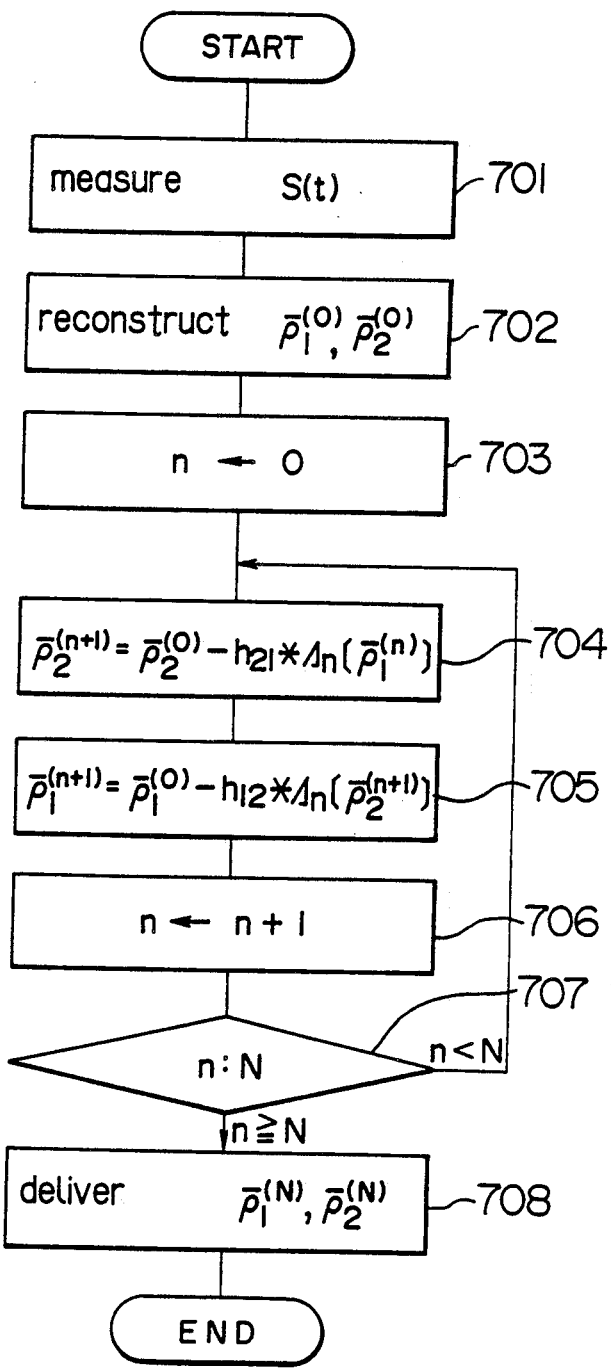
FIG. 7 is a flow chart showing the processing in a second embodiment of the present invention.

FIG. 7 is a flow chart showing the steps of procedure for separating a tomogram due to water and a tomogram due to fat from each other by the second embodiment in a case where the atomic nucleus of hydrogen is detected by magnetic resonance imaging techniques.

Referring to FIG. 7, a resonance signal S(t) is measured on the basis of the pulse sequence of FIG. 3 (step 701). In step 702, a tomogram $\overline{\rho}_1^{(o)}$ due to water and a tomogram $\overline{\rho}_2^{(o)}$ due to fat are reconstructed by the following equation:

$$\overline{\rho}_i^{(o)}(x, y) = \rho dt S(t) exp[+j\gamma\{k_x(t)x + k_y(t)y\}] exp[-j\Delta\omega_i t] W(t) \quad i = 1, 2$$

where the weight coefficient W(t) is given as follows:

$$W(t) = \{k_x(t)^2 + k_y(t)^2\}^{\frac{1}{2}}$$

In step 703, the value of a variable n is made equal to zero.

In step 704, $\overline{\rho}_2^{(n+1)}$ is calculated from $\overline{\rho}_1^{(n)}$ and $\overline{\rho}_2^{(o)}$ by the following equation:

$$\overline{\rho}_2^{(n+1)} = \overline{\rho}_2^{(o)} - h_{21} * \Lambda_n[\rho_1^{(n)}]$$

where $h_{21}$ indicates a PSF given by the equation (6) and $\Lambda_n$ is a function defined by the equation (12).

In step 705, $\overline{\rho}_1^{(n+1)}$ is calculated from $\overline{\rho}_2^{(n+1)}$ and $\rho_1^{(o)}$ by the following equation:

$$\overline{\rho}_1^{(n+1)} = \overline{\rho}_1^{(o)} - h_{12} * \Lambda_n[\overline{\rho}_2^{(n+1)}]$$

In step 706, the value of the variable n is incremented by one.

In step 707, it is checked whether or not a predetermined constant N (for example, N = 10) is greater than the value of the variable n. When it is judged that the constant N is greater than the value of n, the processing in the step 704 is again carried out. When it is judged that the constant N is less than or equal to the value of n, the processing in step 708 is carried out. In the step 708, $\overline{\rho}_1^{(N)}$ and $\overline{\rho}_2^{(N)}$ are delivered to terminate the separation processing.

The threshold parameter $\theta_n$ used in the step 704 is given by, for example, the following equation:

$$\theta_n = \frac{1}{2(n+1)} \max\{Re(\overline{\rho}\{^n\})\} \quad n \geq 0$$

where max{ } indicates a maximum value.

As can be seen from the above explanation, the second embodiment is independent of how the strength of gradient magnetic field varies with time and is also imdependent of the algorithm for reconstructing a tomogram. Further, the second embodiment is applicable to a case where a three-dimensional spin-density image is formed.

In the steps 704 and 705, convolution is carried out on a tomogram. Alternatively, corresponding processing may be carried out for the resonance signal. That is, the processing in the step 704 may be replaced by the following processing. A corrected signal which is obtained by subtracting a component corresponding to $$\Lambda_n[\overline{\rho}\{^n\}]$$

from the resonance signal S(t) is formed as follows:

$$S(t) - \frac{1}{C} \int dx dy \Lambda_n[\overline{\rho}\{^n\}(x,y)] \exp[-j\gamma\{k_x(t)x + k_y(t)y\}] \cdot \exp[+j\Delta\omega_1 t]$$

Then, $\rho_2^{(n+1)}$ is reconstructed from the corrected signal by the equation (3). The processing in the step 705 is replaced by processing similar to the above-mentioned.

Further, in the steps 704 and 705, only a real part on the left-hand side of each equation is used in the next arithmetic operation. Accordingly, in order to reduce the amount of calculation, the right-hand side of each equation may be calculated so that only a real part is obtained.

We claim:

1. An image reconstructing device included in a magnetic resonance imaging apparatus, the device comprising:
   a plurality of magnetic field generating means for generating a static magnetic field, gradient magnetic fields and a high-frequency magnetic field, the static, gradient and high-frequency magnetic fields being applied to an object to be inspected;
   means for controlling the output of each of the magnetic field generating means in accordance with a predetermined procedure;
   means for measuring a resonance signal at a predetermined time while applying a gradient magnetic field whose strength varies with time, to the to-be-inspected object;
   means for constructing a plurality of tomograms by carrying out image reconstruction processing peculiar to each of a plurality of chemical shift components, for the measured resonance signal; and
   means for estimating tomograms corresponding to the chemical shift components from the constructed tomograms.

2. An image reconstructing device according to claim 1, wherein the tomogram estimating means includes means for estimating the influence of chemical shift components other than a desired chemical shift component on the tomogram corresponding to the desired chemical shift component, and means for removing the influence.

3. An image reconstructing device according to claim 2, wherein the influence estimating means includes means for calculating the convolution of the tomogram corresponding to the desired chemical shift component and a predetermined point spread function.

4. An image reconstructing device according to claim 3, wherein the influence estimating means includes means for forming a second tomogram of only the real part of the tomogram corresponding to desired chemical shift component, and means for calculating the convolution of the second tomogram and the predetermined point spread function.

5. An image reconstructing device according to claim 4, wherein the influence estimating means includes means for comparing the value of each picture element of the second tomogram with a threshold value, means for constructing a third tomogram in such a manner that a predetermined value is set to those picture elements of the second tomogram which have a value less than the threshold value, and means for calculating the convolution of the third tomogram and the predetermined point spread function.

6. An image reconstructing device according to claim 2, wherein the influence estimating/removing means includes means for counting the number of influence estimating/removing operations, and means for repeating an influence estimating/removing operation till a counted value reaches a predetermined value.

7. An image reconstructing device according to claim 6, wherein the repetition means includes means for varying the threshold value in a period when the influence estimating/removing operation is repeated.

8. An image reconstructing device included in a magnetic resonance imaging apparatus, the device comprising:
   a plurality of magnetic field generating means for generating a static magnetic field, gradient magnetic fields and a high-frequency magnetic field, the static, gradient and high-frequency magnetic fields being applied to an object to be inspected;
   means for controlling the output of each of the magnetic field generating means in accordance with a predetermined procedure;
   means for measuring a resonance signal at a predetermined time while applying a gradient magnetic field whose strength varies with time, to the to-be-inspected object;
   means for estimating the influence of signals due to chemical shift components other than a desired chemical shift component on a signal due to the desired chemical shift component, on the measured resonance signal;
   means for removing the estimated influence from the measured resonance signal to obtain a corrected resonance signal; and
   means for constructing a plurality of tomograms by carrying out image reconstruction processing peculiar to each of the chemical shift components, for the corrected resonance signal.

* * * * *